US006240142B1

(12) United States Patent
Kaufman et al.

(10) Patent No.: US 6,240,142 B1
(45) Date of Patent: *May 29, 2001

(54) QUADRATURE MODULATOR AND DEMODULATOR

(75) Inventors: Ralph E. Kaufman, La Mesa; Vladimir Aparin, San Diego, both of CA (US)

(73) Assignee: Qualcomm Incorporated, San Diego, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/004,175

(22) Filed: Jan. 7, 1998

(51) Int. Cl.[7] ........................................ H04L 5/12
(52) U.S. Cl. ..................... 375/261; 375/298; 375/329; 329/304; 332/329
(58) Field of Search .................... 375/261, 298, 375/302, 308, 329; 329/304, 306; 332/103

(56) References Cited

U.S. PATENT DOCUMENTS

| 4,816,783 | 3/1989 | Leitch | 332/41 |
| 4,852,123 | 7/1989 | Bickley et al. | 375/9 |
| 4,914,613 | 4/1990 | Kantorowicz | 364/721 |
| 5,412,351 | 5/1995 | Nystrom et al. | 332/103 |

FOREIGN PATENT DOCUMENTS

| 3412191 | 4/1984 | (DE) | H04B/1/28 |
| 9734367 | 9/1997 | (WO) | H03D/7/14 |

OTHER PUBLICATIONS

"Digital Signal Processor Based Programmable BPSK/QPSK Offset–QPSK Modems", Shenoy et al., Comsat Technical Review, Fall 1989 No. 2, Clarksburg MD, pp. 195–233.

*Primary Examiner*—Don N. Vo

(57) ABSTRACT

A quadrature modulator and demodulator which provide the requisite level of performance while minimizing power consumption. In the quadrature modulator, the I and Q signals are provided to two pairs of mixers. Each mixer in a pair of mixers modulates an I or Q signal with the respective inphase or quadrature IF sinusoid. The I and Q modulated signals from each pair of mixers are summed. The signals from the summers are provided to a third pair of mixer and modulated with the respective inphase and quadrature RF sinusoids. The signals from the third pair of mixers are summed and provided as the modulated signal. Using this quadrature modulator topology, the amplitude balance and phase error of the modulated signal are made insensitive to the amplitude imbalance and/or phase error of the quadrature splitters used to generate the IF and RF sinusoids. Furthermore, since the first two pairs of mixers and the two subsequent summers are operated at IF frequency, the performance requirements (e.g., bandwidth and linearity) of these components can be ensured while utilizing less power. The inventive concept can be further adopted for use in a quadrature demodulator.

20 Claims, 5 Drawing Sheets

QUADRATURE MODULATOR AND DEMODULATOR

BACKGROUND OF THE INVENTION

I. Field of the Invention

The present invention relates to communications. More particularly, the present invention relates to a novel and improved quadrature modulator and demodulator.

II. Description of the Related Art

In many modern communication systems, digital transmission is utilized because of improved efficiency and the ability to detect and correct transmission errors. Exemplary digital transmission formats include binary phase shift keying (BPSK), quaternary phase shift keying (QPSK), offset quaternary phase shift keying (OQPSK), m-ary phase shift keying (m-PSK), and quadrature amplitude modulation (QAM). Exemplary communication systems which utilize digital transmission include code division multiple access (CDMA) communication systems and high definition television (HDTV) systems. The use of CDMA techniques in a multiple access communication system is disclosed in U.S. Pat. No. 4,901,307, entitled "SPREAD SPECTRUM MULTIPLE ACCESS COMMUNICATION SYSTEM USING SATELLITE OR TERRESTRIAL REPEATERS", and U.S. Pat. No. 5,103,459, entitled "SYSTEM AND METHOD FOR GENERATING WAVEFORMS IN A CDMA CELLULAR TELEPHONE SYSTEM", both assigned to the assignee of the present invention and incorporated by reference herein. An exemplary HDTV system is disclosed in U.S. Pat. No. 5,452,104, U.S. Pat. No. 5,107,345, and U.S. Pat. No. 5,021,891, all three entitled "ADAPTIVE BLOCK SIZE IMAGE COMPRESSION METHOD AND SYSTEM", and U.S. Pat. No. 5,576,767, entitled "INTERFRAME VIDEO ENCODING AND DECODING SYSTEM", all four patents are assigned to the assignee of the present invention and incorporated by reference herein.

In the CDMA system, a base station communicates with one or more remote stations. The base station is typically located at a fixed location. Thus, power consumption is less important consideration in the design of the base station. The remote stations are typically consumer units which are produced in high quantity. Thus, cost and reliability are important design considerations because of the number of units produced. Furthermore, in some applications such as a CDMA mobile communication system, power consumption is critical because of the portable nature of the remote station. Tradeoffs between performance, cost, and power consumption are usually made in the design of the remote stations.

In digital transmission, the digitized data is used to modulated a carrier sinusoid using one of the formats listed above. The modulated waveform is further processed (e.g. filtered, amplified, and upconverted) and transmitted to the destination device. At the destination device, the transmitted RF signal is received and demodulated by a receiver.

A block diagram of an exemplary transmitter 100 of the prior art which is used for quadrature modulation of QPSK, OQPSK, and QAM signals is illustrated in FIG. 1A. Transmitter 100 can be used at the base station or the remote station. Within quadrature modulator 110a of transmitter 100, the inphase (I) and quadrature (Q) signals are provided to mixers 112a and 112b which modulate the signals with the inphase and quadrature intermediate frequency (IF) sinusoids, respectively. Quadrature splitter 114 receives the IF sinusoid (IF LO) and provides the inphase and quadrature IF sinusoids which are approximately equal in amplitude and 90 degrees out of phase with respect to each other. The modulated I and Q signals from mixers 112a and 112b are provided to summer 116 and combined. In many applications, the signal from summer 116 is provided to mixer 118 which upconverts the signal to the desired frequency with the radio frequency (RF) sinusoid (RF LO). Although not shown in FIG. 1A for simplicity, filtering and/or amplification can be interposed between successive stages of summers and mixers.

The modulated signal from mixer 118 is provided to filter 130 which filters out undesirable images and spurious signals. The filtered signal is provided to amplifier (AMP) 132 which amplifies the signal to produce the required signal amplitude. The amplified signal is routed through duplexer 134 and transmitted from antenna 136 to the destination device.

A block diagram of an exemplary direct quadrature modulator 110b is shown in FIG. 1B. Within direct quadrature modulator 110b, the I and Q signals are provided to mixers 152a and 152b which modulate the signals with the inphase and quadrature RF sinusoids, respectively. Quadrature splitter 154 receives the direct RF sinusoid (direct RF LO) and provides the inphase (I LO) and quadrature (Q LO) sinusoids which are approximately equal in amplitude and 90 degrees out of phase with respect to each other. The modulated I and Q signals from mixers 152a and 152b are provided to summer 156 and combined to provide the modulated signal.

Quadrature modulator 110a performs modulation using a two steps process whereby quadrature modulation is performed at an IF frequency and upconverted to the desired RF frequency. Quadrature modulator 110a offers several advantages. First, quadrature splitter 114 can be more easily designed and manufactured to meet the required specification at the lower IF frequency. Second, the two sinusoids design (IF LO and RF LO) offers flexibility in the frequency plan and simplification of the filtering.

Direct quadrature modulator 110b performs the same functions as quadrature modulator 110a. However, direct quadrature modulator 110b performs modulation directly at the desired RF frequency using a single step process, thereby eliminating the upconversion step. The simplicity in the design of modulator 110b is offset by the performance requirements of quadrature splitter 154. In particular, it is much more difficult to design and manufacture quadrature splitter 154 having the required amplitude balance and quadrature phase at the higher RF frequency.

A method for generating inphase and quadrature sinusoids at RF frequency having the required performance is disclosed in U.S. Pat. No. 5,412,351, entitled "QUADRATURE LOCAL OSCILLATOR NETWORK", and incorporated by reference herein. A block diagram of quadrature local oscillator network 170 as disclosed in U.S. Pat. No. 5,412,351 is shown in FIG. 1C. Within quadrature local oscillator network 170, the IF sinusoid is provided to quadrature splitter 172 which provides the inphase and quadrature IF sinusoids. The inphase IF sinusoid is provided to mixers 176a and 176d and the quadrature IF sinusoid is provided to mixers 176b and 176c. Similarly, the RF sinusoid is provided to quadrature splitter 174 which provides the inphase and quadrature RF sinusoids. The inphase RF sinusoid is provided to mixers 176b and 176d and the quadrature RF sinusoid is provided to mixers 176a and 176c. Mixers 176a and 176b mix the two input signals and provide the upconverted signals to summer 178a which combines the signals to provide the inphase direct sinusoid (I LO). Similarly, mixers 176c and 176d mix the two input signals and provide the upconverted signals to summer 178b which combines the signals to provide the quadrature direct sinusoid (Q LO). The inphase and quadrature direct sinusoids can be provided to mixers 152a and 152b, respectively, as shown in FIG. 1B.

Ideally, the inphase and quadrature sinusoids from a phase splitter are equal in amplitude and 90 degrees out of phase with respect to each other. At the RF frequency, this is difficult to achieve. For ideal quadrature splitters 172 and 174 (with no amplitude imbalance and no phase error), the inphase (I LO) and quadrature (Q LO) sinusoids are exactly equal in amplitude and 90 degree out of phase with respect to each other. Each sinusoid comprises a single tone at the difference frequency ($f_{RF}$–$f_{IF}$) and no other mixing terms. The I LO and Q LO can be expressed as:

$$I\_LO(t) = \cos(\omega_{RF} - \omega_{IF})t$$
$$Q\_LO(t) = \sin(\omega_{RF} - \omega_{IF})t \quad (1)$$

Although quadrature local oscillator network 170 in FIG. 1C is configured to produce sinusoids at the difference frequency ($f_{RF}$–$f_{IF}$), network 170 can also be reconfigured to produce sinusoids at the sum frequency ($f_{RF}$+$f_{IF}$).

Quadrature local oscillator network 170 generates inphase and quadrature sinusoids which have improved performance over sinusoids generated by other quadrature splitters of the prior art. In particular, quadrature local oscillator network 170 substantially reduces the sensitivity of the output sinusoids to amplitude imbalance and/or phase error in quadrature splitters 172 and 174. Amplitude imbalance and/or phase error in quadrature splitters 172 and 174 do not substantially affect the amplitude balance and quadrature phase of the output sinusoids. Instead, amplitude imbalance and phase error of quadrature splitters 172 and 174 manifest themselves as spurious signals which can be filtered. For example, an amplitude imbalance of $\Delta$ at an output of quadrature splitter 172 or 174 results in I LO and Q LO sinusoids which can be expressed as:

$$I\_LO(t) = \left(1 + \frac{\Delta}{2}\right)\cos(\omega_{RF} - \omega_{IF})t + \left(\frac{\Delta}{2}\right)\cos(\omega_{RF} + \omega_{IF})t \quad (2)$$
$$Q\_LO(t) = \left(1 + \frac{\Delta}{2}\right)\sin(\omega_{RF} - \omega_{IF})t + \left(\frac{\Delta}{2}\right)\sin(\omega_{RF} + \omega_{IF})t.$$

As used in this specification, an amplitude imbalance of $\Delta$ denotes that one output sinusoid from a quadrature splitter has an amplitude of 1 and the other output sinusoid has an amplitude of (1+$\Delta$). From equation (2), each output from network 170 comprises the desired sinusoid and a spurious signal. The spurious signal has an amplitude of half the amplitude error ($\Delta/2$) and is located at $2f_{IF}$ from the desired sinusoid. This spurious signal is small in amplitude and can be filtered. More importantly, notice that the desired output sinusoids from network 170 are still amplitude balanced and in quadrature phase with each other.

A phase error of $\phi$ at an output of quadrature splitter 172 or 174 results in I LO and Q LO sinusoids which can be expressed as:

$$I\_LO(t) = \cos(\omega_{RF} - \omega_{IF})t \cdot \left[\frac{1}{2} + \frac{\cos(\phi)}{2}\right] + \quad (3)$$
$$\cos(\omega_{RF} + \omega_{IF})t \cdot \left[\frac{1}{2} - \frac{\cos(\phi)}{2}\right] +$$
$$\sin(\omega_{RF} + \omega_{IF}) \cdot \left[\frac{\sin(\phi)}{2}\right] -$$
$$\sin(\omega_{RF} - \omega_{IF}) \cdot \left[\frac{\sin(\phi)}{2}\right]$$
$$Q\_LO(t) = \sin(\omega_{RF} - \omega_{IF})t \cdot \left[\frac{1}{2} + \frac{\cos(\phi)}{2}\right] +$$
$$\sin(\omega_{RF} + \omega_{IF})t \cdot \left[\frac{1}{2} - \frac{\cos(\phi)}{2}\right] +$$
$$\cos(\omega_{RF} + \omega_{IF}) \cdot \left[\frac{\sin(\phi)}{2}\right] +$$
$$\cos(\omega_{RF} - \omega_{IF}) \cdot \left[\frac{\sin(\phi)}{2}\right].$$

As used in this specification, a phase error $\phi$ denotes that the phase of the quadrature sinusoid is ($90°\pm\phi$) with respect to the phase of the inphase sinusoid. From equation (3), notice that the phase error $\phi$ results in each output from network 170 comprising the desired sinusoid and two spurious signals having amplitudes of [½–cos($\phi$)/2] and [sin($\phi$)/2] and located at $2f_{IF}$ from the desired sinusoid. For small phase error $\phi$, the spurious signals are small in amplitude. In addition, the spurious signals can be filtered since they are located at $2f_{IF}$ from the desired sinusoid. Each output from network 170 also comprises a small quadrature component of the desired sinusoid having an amplitude of sin ($\phi$)/2. This quadrature component causes a slight rotation in the phase of the output sinusoid. However, since the inphase and quadrature output sinusoids comprise quadrature components having the sample amplitude {sin($\phi$)/2}, the 90 degree phase difference between the output sinusoids is maintained.

Although quadrature local oscillator network 170 provides the requisite performance, a major disadvantage is the power consumption. Notice in FIG. 1C that all four mixers 176 and both summers 178 operate at the RF frequency. To achieve the required circuit performance (e.g., bandwidth and linearity) at RF frequency, these circuits are biased with high current. For some applications, such as CDMA communication system, power consumption is a critical design parameter. There exists a long felt need in the industry to provide a quadrature modulator and demodulator which provide the requisite level of performance while minimizing power consumption.

SUMMARY OF THE INVENTION

The present invention is a new and improved quadrature modulator and demodulator which provide the requisite level of performance while minimizing power consumption. In the quadrature modulator of the present invention, the I and Q signals are provided to two pairs of mixers. Each mixer in a pair of mixers modulates an I or Q signal with the respective inphase or quadrature IF sinusoid. The I and Q modulated signals from each pair of mixers are summed. The signals from the summers are provided to a third pair of mixer and modulated with the respective inphase and quadrature RF sinusoid. The signals from the third pair of mixers are summed and provided as the modulated signal.

It is an object of the present invention to provide a quadrature modulator with improved performance. In the present invention, the inphase and quadrature IF sinusoids and the inphase and quadrature RF sinusoids are provided by two quadrature splitters. Each of the two quadrature splitters produces inphase and quadrature sinusoids which can have amplitude imbalance and/or phase error. Using the quadrature modulator topology of the present invention, the amplitude balance and quadrature phase of the modulated signal are made insensitive to the amplitude imbalance and/or phase error of the quadrature splitters. This results in improved performance of the quadrature modulator while relaxing the requirements of the quadrature splitters.

It is another object of the present invention to provide a quadrature modulator which utilizes the minimal amount of power while providing the requisite level of performance. In the quadrature modulator of the present invention, the first two pairs of mixers and the two subsequent summers are operated at the IF frequency. At the IF frequency, the circuit performance requirements (e.g., bandwidth and linearity) of these components can be ensured while utilizing less power.

It is yet another object of the present invention to provide a quadrature modulator wherein the center frequency of the modulated signal is not at the same frequency as the frequency of the IF sinusoids or the RF sinusoids. This feature reduces problems associated with sinusoidal bleedthrough from the IF or RF sinusoidals onto the modulated signal output.

The inventive concept of the present invention can be further adopted for use as a quadrature demodulator. In this embodiment, the RF signal is provided to two mixers which downconvert the RF signal with the inphase and quadrature RF sinusoids. The signal from each mixer is provided to a pair of mixer which demodulate the signal with the inphase and quadrature IF sinusoids. The demodulated signals from pair of corresponding mixers are provided to a summer which combines the signals to provided the demodulated I or Q baseband signal. The quadrature demodulator provides demodulated signals which are amplitude balanced and in quadrature to each other while minimizing sensitivity to the amplitude imbalance and phase error caused by the quadrature splitters used to generate the inphase and quadrature IF and RF sinusoids. Furthermore, power consumption is minimized because four of the mixers and two summers are operated at IF frequency.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1A:
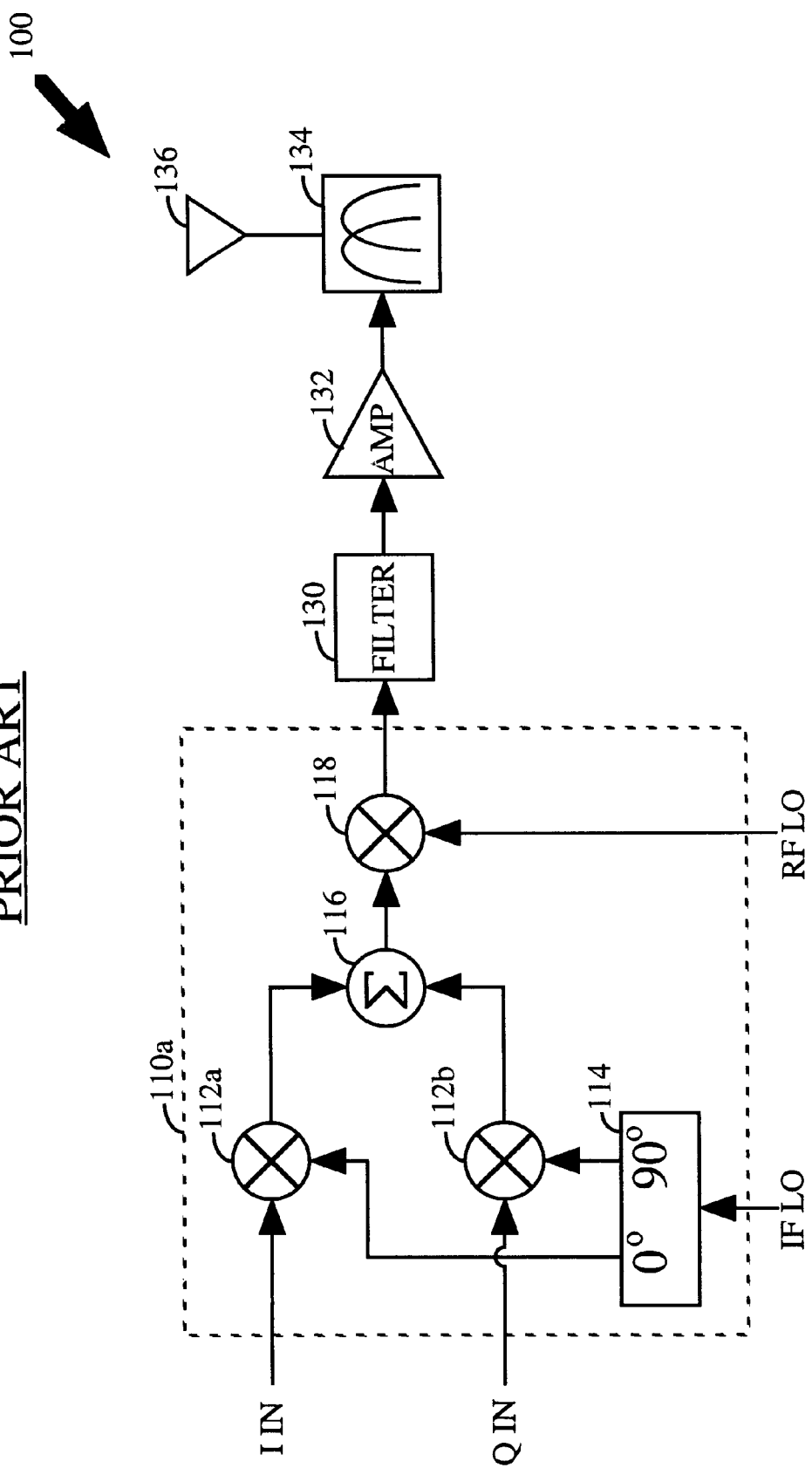
FIG. 1A is a block diagram of an exemplary transmitter of the prior art which is used for quadrature modulation of QPSK, OQPSK, and QAM signals.
Figure 1B:
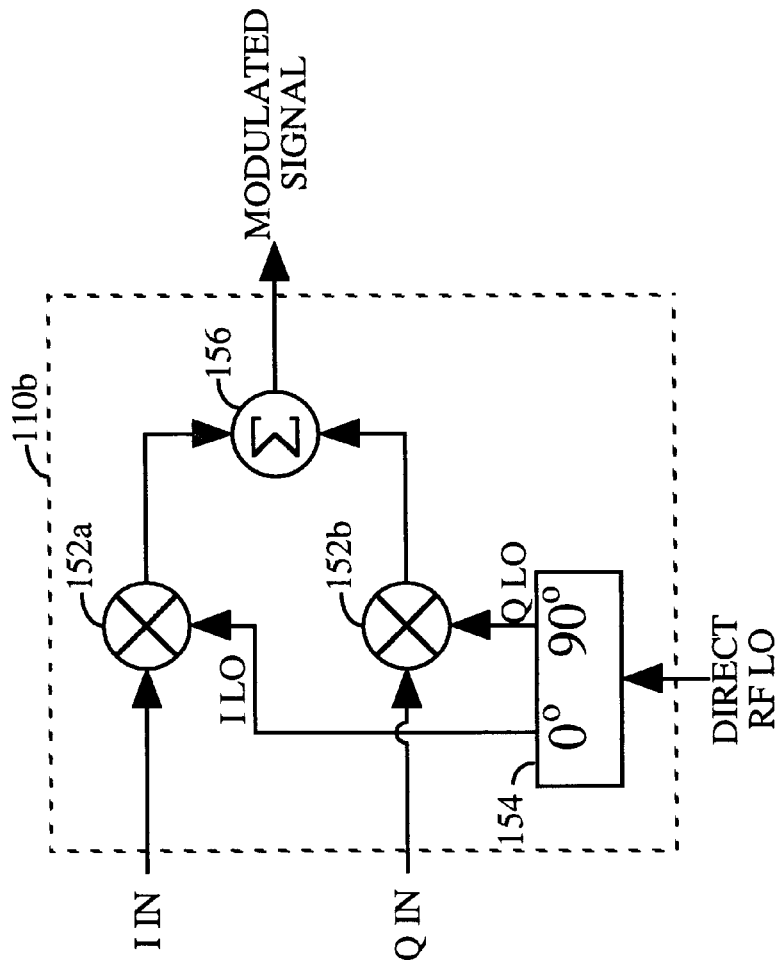
FIG. 1B is a block diagram of an exemplary direct quadrature modulator of the prior art.
Figure 1C:
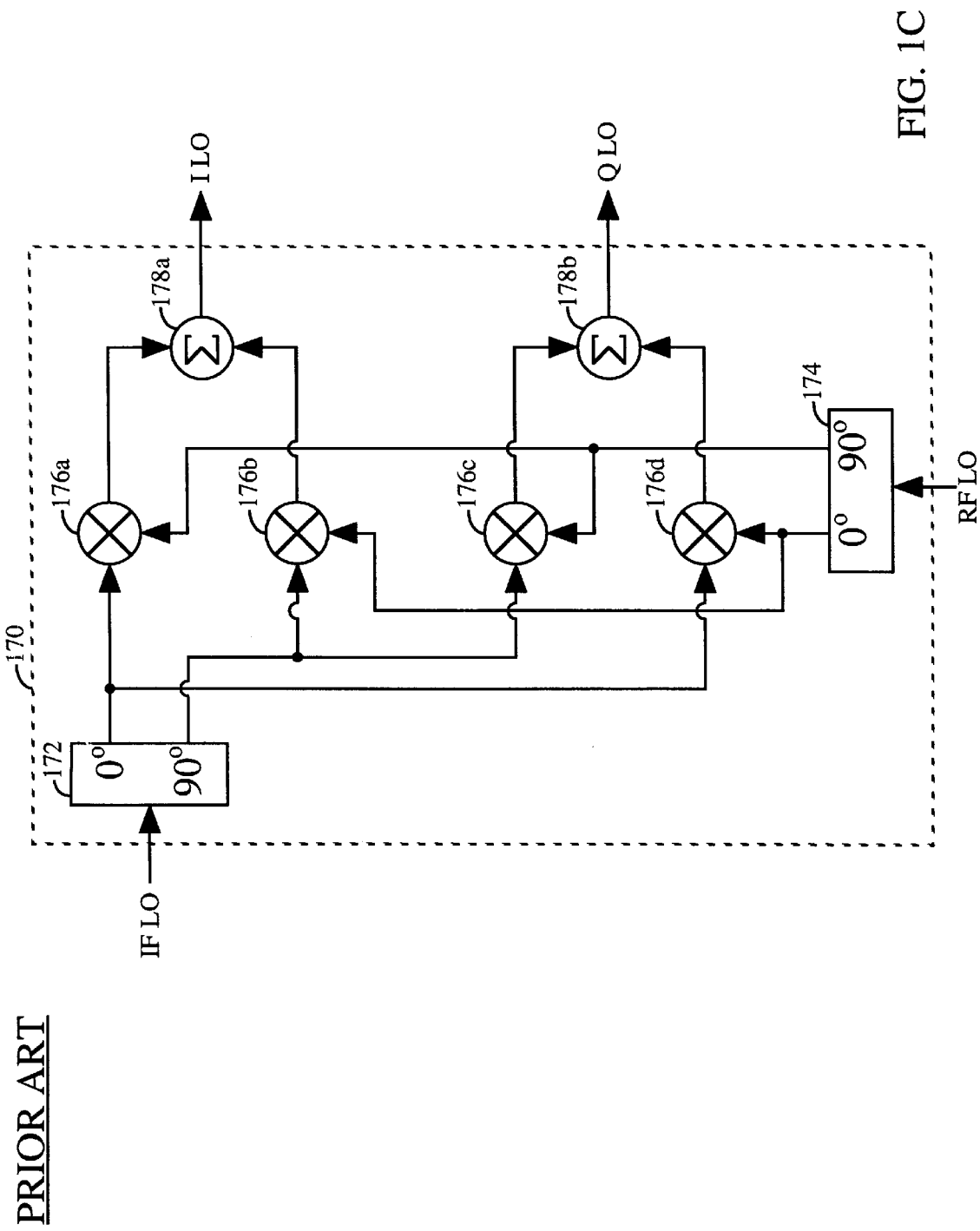
FIG. 1C is a block diagram of the quadrature local oscillator network of the prior art.
Figure 2:
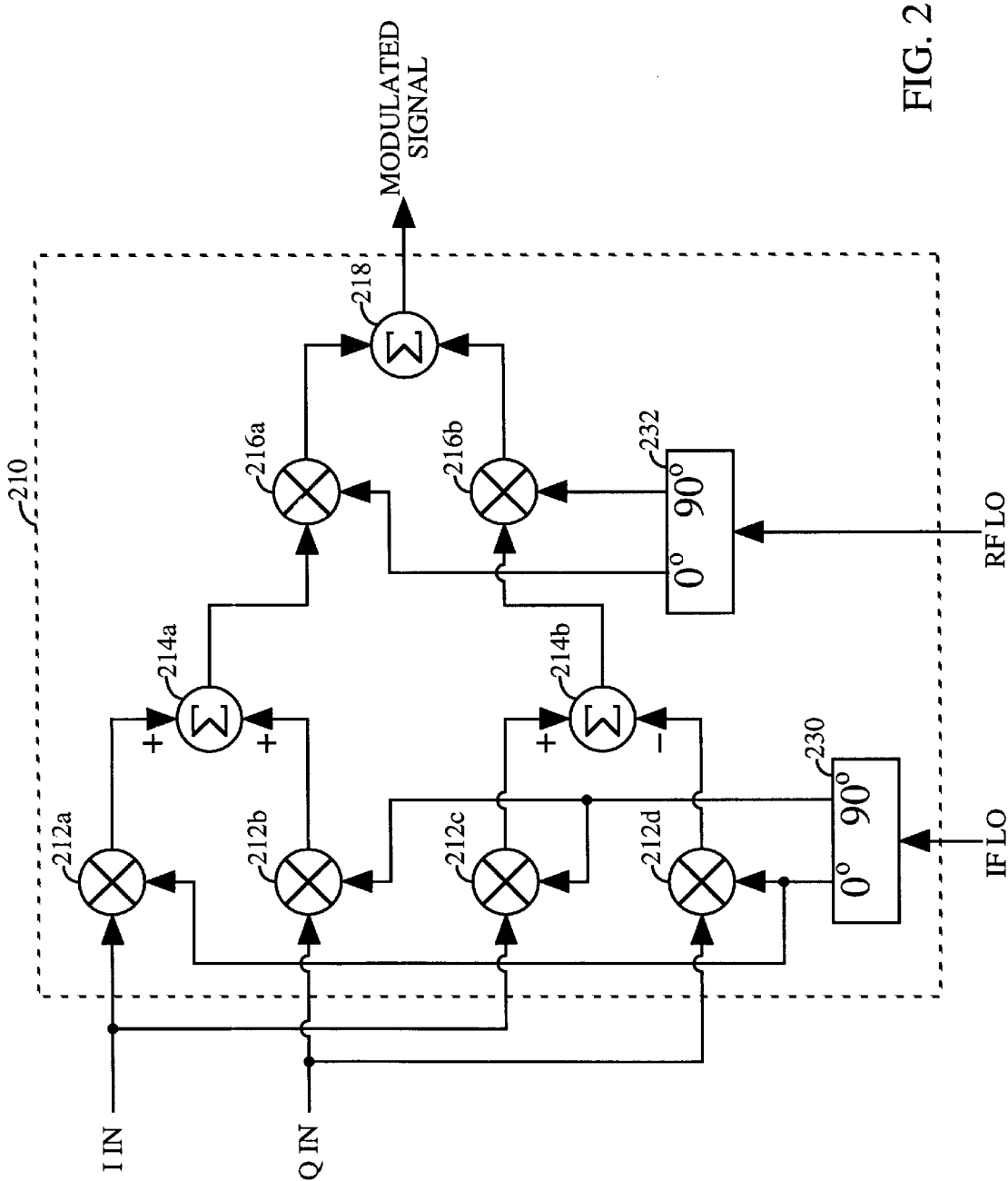
FIG. 2 is a block diagram of an exemplary quadrature modulator of the present invention which is used for quadrature modulation of QPSK, OQPSK, QAM, and various other modulation formats, including frequency modulation (FM)

Referring to the figures, a block diagram of an exemplary quadrature modulator 210 of the present invention which is used for quadrature modulation of QPSK, OQPSK, QAM, and various other modulation formats, including FM, is illustrated in FIG. 2. Quadrature modulator 210 can be incorporated into any transmission system, such as CDMA transmission systems. Within quadrature modulator 210, the I signal (I IN) is provided to mixers 212a and 212c and the Q signal (Q IN) is provided to mixers 212b and 212d. In the exemplary embodiment, the Q IN signal is in quadrature (90 degree phase offset) with respect to the I IN signal. Mixers 212a and 212d also receive the inphase IF sinusoid and mixers 212b and 212c also receive the quadrature IF sinusoid. Each mixer 212 modulate the respective input signal with the respective sinusoid to produce a respective I or Q modulated signal. The modulated I and Q signals from mixers 212a and 212b, respectively, are provided to summer 214a and combined. The modulated I and Q signals from mixers 212c and 212d, respectively, are provided to summer 214b which subtracts the Q modulated signal from the I modulated signal. The difference performed by summer 214b can also be achieved by summing the two inputs of summer 214b and inverting the Q signal to mixer 212d or inverting the inphase sinusoid to mixer 212d. The signals from summers 214a and 214b are provided to mixers 216a and 216b, respectively. Mixers 216a and 216b also receive the inphase and quadrature RF sinusoids, respectively, from quadrature splitter 232 and upconvert the input signals with the respective sinusoids. The upconverted signals from mixers 216a and 216b are provided to summer 218 which combines the signals to provide the modulated signal. Although not shown in FIG. 2 for simplicity, filtering and/or amplification can be provided between successive stages of mixers and summers to provide the desired signal conditioning.

Quadrature splitter 230 receives the IF sinusoid (IF LO) and provides the inphase and quadrature IF sinusoids which are approximately equal in amplitude and 90 degrees out of phase with respect to each other. Similarly, quadrature splitter 232 receives the RF sinusoid (RF LO) and provides the inphase and quadrature RF sinusoids which are approximately equal in amplitude and 90 degrees out of phase with respect to each other. Quadrature splitters 230 and 232 can be implemented in many embodiments. For example, the quadrature splitter can be implemented as an etched element on a circuit board using coupled transmission lines (as disclosed in the aforementioned U.S. Pat. No. 5,412,351), a Wilkinson structure, or other distributed techniques which are known in the art. The quadrature splitter can also be implemented using lump elements, such as a hybrid coupler which is commercially available. The quadrature splitter can also be implemented using a phase lock loop wherein the phase error and/or amplitude imbalance of the inphase and quadrature sinusoids are minimized by a feedback loop. In the preferred embodiment, quadrature splitters 230 and 232 are implemented using active devices. An exemplary design of a quadrature splitter using active devices is disclosed U.S. patent application Ser. No. 08/862,094, entitled "ACTIVE PHASE SPLITTER", filed May, 22, 1997, assigned to the assignee of the present invention and incorporated by reference herein.

Similarly, mixers 212 and 216 can be implemented in many embodiments. The mixer can be implemented as a single balance or double balance mixer using diodes in the manner known in the art. Alternatively, the mixer can be implemented with Gilbert cell multiplier using active devices. In general, the mixer can be implemented using any non-linear device and appropriate filtering. Therefore, the various implementations of mixers 212 and 216 can be contemplated and are within the scope of the present invention.

Summers 214 and 218 can be implemented with passive summing elements (such as resistive networks) or active circuits (such as summing amplifiers). In the preferred embodiment, summers 214 and 218 are incorporated within mixers 212 and 216, respectively, by proper design of mixers 212 and 216. For example, mixers 212 and 216 can be implemented with Gilbert cell multipliers and the current outputs of a corresponding pair of multipliers are cross-connected together to provide the combined output. The implementation of a mixer pair (e.g., 212a and 212b) and a summer (e.g., 214a) using a pair of Gilbert cell multipliers is disclosed in the aforementioned U.S. Pat. No. 5,412,351.

For ideal quadrature splitters 230 and 232 having no amplitude imbalance and no phase error, the modulated output from quadrature modulator 210 can be expressed as:

$$M(t) = I\cos(\omega_{IF}t)\cos(\omega_{RF}t) + I\sin(\omega_{IF}t)\sin(\omega_{RF}t) + \quad (4)$$
$$Q\sin(\omega_{IF}t)\cos(\omega_{RF}t) - Q\cos(\omega_{IF}t)\sin(\omega_{RF}t)$$
$$= I\cos(\omega_{RF} - \omega_{IF})t - Q\sin(\omega_{RF} - \omega_{IF})t.$$

Notice that the I and Q signals are modulated to the difference frequency ($f_{RF}-f_{IF}$). Quadrature modulator 210 can also be configured to produce a modulated signal at the sum frequency ($f_{RF}+f_{IF}$). This can be achieved by providing a respective inphase or quadrature sinusoid to each mixer 212 and 216 and proper combination of the I and Q modulated signals {e.g., adding the signals or taking the difference} by each summer 214 and 218.

The performance of quadrature modulator 210 of the present invention can be quantify for amplitude imbalance and phase error introduced by quadrature splitters 230 and 232. For an amplitude imbalance of Δ at an output of quadrature splitter 230 or 232, the modulated signal can be expressed as:

$$M(t) = I\left(1 + \frac{\Delta}{2}\right)\cos(\omega_{RF} - \omega_{IF})t + I\left(\frac{\Delta}{2}\right)\cos(\omega_{RF} + \omega_{IF})t + \quad (5)$$
$$Q\left(1 + \frac{\Delta}{2}\right)\sin(\omega_{RF} - \omega_{IF})t \mp Q\left(\frac{\Delta}{2}\right)\sin(\omega_{RF} + \omega_{IF})t.$$

From equation (5), the modulated signal comprises spurious signals having an amplitude of half the amplitude error (Δ/2) and located at $2\omega_{IF}$ from the desired signal. An amplitude error of Δ in quadrature splitter 230 results in a spurious signal of $-Q(\Delta/2)\sin(\omega_{IF}+\omega_{IF})t$ in the quadrature component of the modulated signal and an amplitude error of Δ in quadrature splitter 232 results in a spurious signal of $Q(\Delta/2)\sin(\omega_{IF}+\omega_{IF})t$. This distinction is denoted by the $\mp$ term in equation (5). The spurious signals are small in amplitude (Δ/2) and can be filtered since they are located at $2f_{IF}$ from the desired signal. More importantly, the desired components at the difference frequency are still amplitude balanced and in quadrature with each other.

A phase error of φ at an output of quadrature splitter 230 or 232 results in the modulated signal which can be expressed as:

$$M(t) = \cos(\omega_{RF} - \omega_{IF})t \cdot \left[\frac{I}{2} + \frac{I\cos(\phi)}{2}\right] + \quad (6)$$
$$\cos(\omega_{RF} + \omega_{IF})t \cdot \left[\frac{I}{2} - \frac{I\cos(\phi)}{2}\right] \mp$$
$$\sin(\omega_{RF} - \omega_{IF})t \cdot \left[\frac{I\sin(\phi)}{2}\right] +$$
$$\sin(\omega_{RF} + \omega_{IF})t \cdot \left[\frac{I\sin(\phi)}{2}\right] +$$
$$\sin(\omega_{RF} - \omega_{IF})t \cdot \left[\frac{Q}{2} + \frac{Q\cos(\phi)}{2}\right] +$$
$$\sin(\omega_{RF} + \omega_{IF})t \cdot \left[\mp\frac{Q}{2} \pm \frac{Q\cos(\phi)}{2}\right] \pm$$
$$\cos(\omega_{RF} - \omega_{IF})t \cdot \left[\frac{Q\sin(\phi)}{2}\right] \pm$$
$$\cos(\omega_{RF} + \omega_{IF})t \cdot \left[\frac{Q\sin(\phi)}{2}\right].$$

In equation (6), some terms are denoted by the ± designation and one term is noted by the ∓ designation. The upper sign of these designations denotes the sign of the term associated with a phase error φ in quadrature splitter 230 and the lower sign denotes the sign of the term associated with a phase error φ in quadrature splitter 232. Thus, a phase error φ in either quadrature splitters 230 or 232 causes the same spurious signals. However, the sign of some spurious signals are different depending on whether the phase error φ is from quadrature splitter 230 or 232.

Several observations can be made from equation (6). First, notice that the phase error φ results in the modulated signal comprising four spurious components having amplitudes of [½−cos(φ)/2] and [sin(φ)/2] and located at $2f_{IF}$ from the desired signal. For small phase error φ, these spurious signals are small in amplitude. In addition, these spurious signals can be filtered since they are located at $2f_{IF}$ from the frequency of the desired signal. The modulated signal also comprises small spurious quadrature components of the desired signals having an amplitude of sin(φ)/2. These spurious quadrature components cause a slight rotation in the phase of the I and Q components in the modulated signal. However, since these spurious quadrature components have the same amount amplitude and are in quadrature with each other, the amplitude balance and quadrature phase of the I and Q components are maintained.

An exemplary application of quadrature modulator 210 is for CDMA communication systems which are designed to operate at the cellular and/or personal communication service (PCS) band. In the exemplary embodiment, the IF sinusoid is generated using a phase lock loop and is fixed at nominal frequency of 130 MHz. It can be readily observed that IF sinusoids at other frequencies can be utilized and are within the scope of the present invention. In the exemplary embodiment, quadrature modulator 210 is configured to produce the modulated signal at the difference frequency ($f_{RF}-f_{IF}$). However, quadrature modulator 210 can also be reconfigured to produce the modulated signal at the sum frequency ($f_{RF}+f_{IF}$) and this is within the scope of the present invention. Quadrature modulator 210 can be designed to operate at the cellular band (824 MHz to 849 MHz) or the PCS band (1850 MHz to 1910 MHz). In the exemplary embodiment, the frequency of the RF sinusoid is selected to be the desired output frequency $f_O$ plus the frequency of the IF sinusoid ($f_O+f_{IF}$). This results in the modulated signal at the desired output frequency $f_O$.

Figure 3:
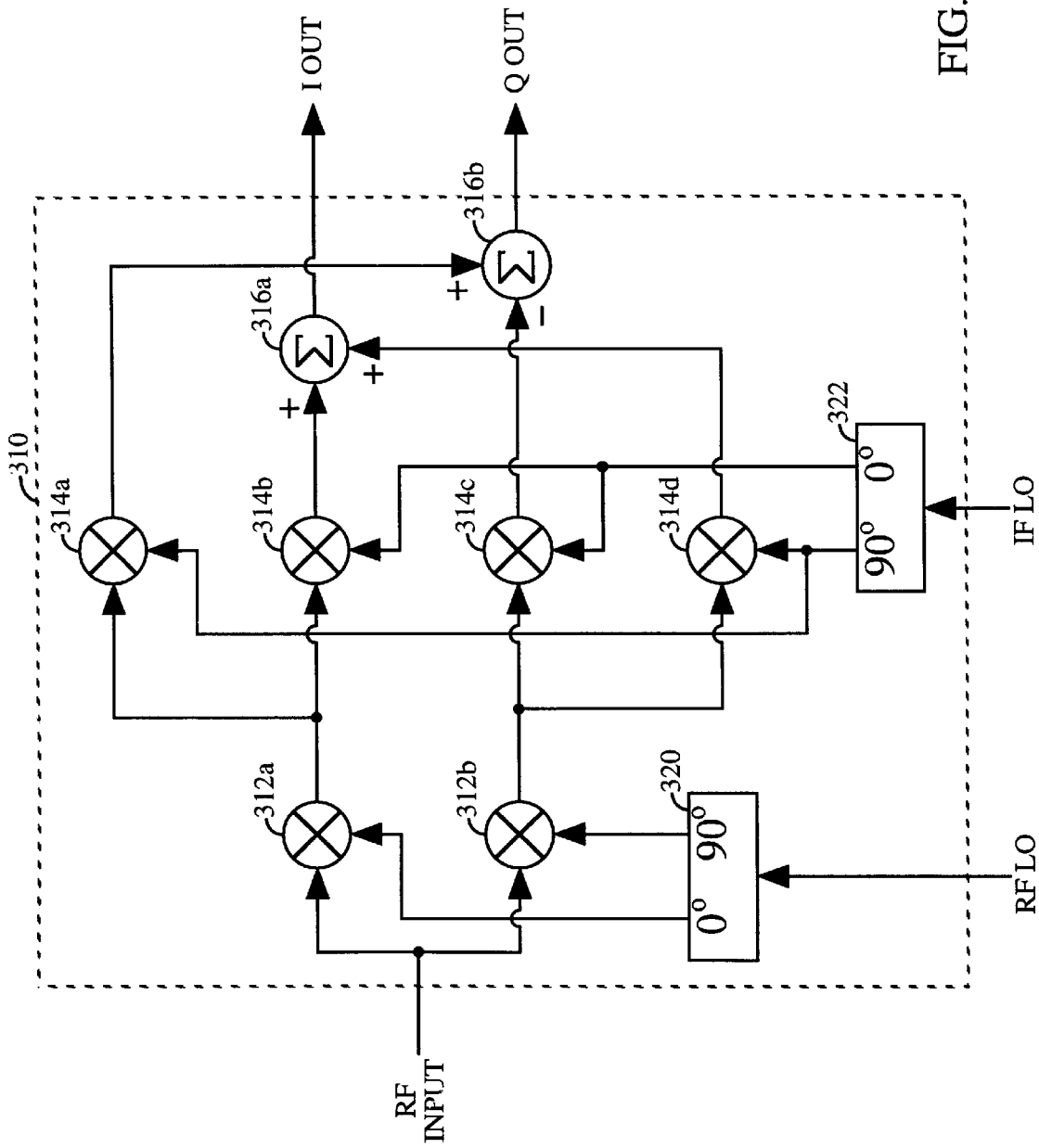
FIG. 3 is a block diagram of an exemplary quadrature demodulator of the present invention which is used for quadrature demodulation of QPSK, OQPSK, QAM, and various other modulation formats, including FM.

A block diagram of an exemplary quadrature demodulator 310 of the present invention which is used for quadrature demodulation of QPSK, OQPSK, QAM, and various other modulation formats, including FM, is illustrated in FIG. 3. Quadrature demodulator 310 can be incorporated into any receiving system, such as those for CDMA communication systems. Within quadrature demodulator 310, the received RF signal is provided to mixers 312a and 312b. Mixers 312a also receives the inphase RF sinusoid, downconverts the RF signal, and provides the downconverted signal to mixers 314a and 314b. Similarly, mixers 312b also receives the quadrature RF sinusoid, downconverts the RF signal, and provides the downconverted signal to mixers 314c and 314d. Mixers 314b and 314c also receive the inphase IF sinusoid and mixers 314a and 314d also receive the quadrature IF sinusoid. Each mixer 314 demodulates the input signal with the respective IF sinusoid. The demodulated signals from mixers 314b and 314d are provided to summer 316a which combines the signal to provide the I output. The demodulated signals from mixers 314a and 314c are provided to summer 316b which subtracts the signal from mixer 314c from the signal from mixer 314a to provide the Q output.

Quadrature splitter 320 receives the RF sinusoid (RF LO) and provides the inphase and quadrature RF sinusoids which are approximately equal in amplitude and 90 degrees out of phase with respect to each other. Similarly, quadrature splitter 322 receives the IF sinusoid (IF LO) and provides the inphase and quadrature IF sinusoids which are approximately equal in amplitude and 90 degrees out of phase with respect to each other. Mixers 312 and 314, summers 316, and quadrature splitters 320 and 322 can be designed and implemented in the manner described above. As stated above, filters and/or amplifiers can be interposed between successive stages of mixers and summers to provide the desired signal conditioning.

The quadrature modulator and demodulator of the present invention can be implemented using many embodiments, some of which are described above. In the preferred embodiment, the quadrature modulator and demodulator are implemented within an application specific integrated circuit (ASIC) using active devices. The active devices can be bipolar-junction transistors (BJT), heterojunction-bipolar-transistor (HBT), metal-oxide-semiconductor field effect transistors (MOSFET), gallium arsenide field effect transistors (GaAsFET), P-channel devices, or other active semiconductor devices.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. A quadrature modulator comprising:
   a first quadrature splitter for receiving a first sinusoid and providing a first inphase sinusoid and a first quadrature sinusoid;
   a second quadrature splitter for receiving a second sinusoid and providing a second inphase sinusoid and a second quadrature sinusoid;
   a first mixer connected to said first quadrature splitter for receiving said first inphase sinusoid, said first mixer also receiving a first data signal and providing a first modulated signal;
   a second mixer connected to said first quadrature splitter for receiving said first quadrature sinusoid, said second mixer also receiving a second data signal and providing a second modulated signal;
   a third mixer connected to said first quadrature splitter for receiving said first quadrature sinusoid, said third mixer also receiving said first data signal and providing a third modulated signal;
   a fourth mixer connected to said first quadrature splitter for receiving said first inphase sinusoid, said fourth mixer also receiving said second data signal and providing a fourth modulated signal;
   a first summer connected to said first and second mixers;
   a second summer connected to said third and fourth mixers, and connected to subtract an output from said fourth mixer from an output of said third mixer;
   a fifth mixer connected to said first summer and to said second quadrature splitter, said fifth mixer receiving said second inphase sinusoid and providing a fifth modulated signal;
   a sixth mixer connected to said second summer and to said second quadrature splitter, said sixth mixer receiving said second quadrature sinusoid and providing a sixth modulated signal; and
   a third summer connected to said fifth and sixth mixers, said third summer providing a resultant modulated signal.

2. The quadrature modulator of claim 1 wherein said first and second data signals comprise I and Q signals, respectively.

3. The quadrature modulator of claim 1 wherein said quadrature splitters are implemented with active devices.

4. The quadrature modulator of claim 3 wherein said active devices comprise MOSFETs.

5. The quadrature modulator of claim 3 wherein said active devices comprise bipolar transistors.

6. The quadrature modulator of claim 1 wherein said quadrature splitters comprise phasing shifting capacitors.

7. The quadrature modulator of claim 1 wherein said mixers are implemented with Gilbert cell multipliers.

8. The quadrature modulator of claim 7 wherein said Gilbert cell multipliers comprise MOSFETs.

9. The quadrature modulator of claim 7 wherein said Gilbert cell multipliers comprise bipolar transistors.

10. The quadrature modulator of claim 7 wherein said summers are implemented by cross-coupling outputs of said Gilbert cell multipliers.

11. The quadrature modulator of claim 1 wherein said quadrature splitters, mixers, and summers are implemented using active devices.

12. The quadrature modulator of claim 1 wherein said quadrature splitters, mixers, and summers are implemented within an ASIC.

13. The quadrature modulator of claim 1 wherein said resultant modulated signal is a QPSK modulated signal.

14. The quadrature modulator of claim 1 wherein said resultant modulated signal is a OQPSK modulated signal.

15. The quadrature modulator of claim 1 wherein said resultant modulated signal is a QAM modulated signal.

16. A modulator comprising:
    a first quadrature splitter for receiving a first sinusoid and providing a second sinusoid and a third sinusoid;
    a second quadrature splitter for receiving a fourth sinusoid and providing a fifth sinusoid and a sixth sinusoid;
    a first mixer connected to said first quadrature splitter for receiving said second sinusoid, said first mixer also receiving a first data signal and providing a first modulated signal;
    a second mixer connected to said first quadrature splitter for receiving said third sinusoid, said second mixer also receiving a second data signal and providing a second modulated signal;

a third mixer connected to said first quadrature splitter for receiving said third sinusoid, said third mixer also receiving said first data signal and providing a third modulated signal;

a fourth mixer connected to said first quadrature splitter for receiving said second sinusoid, said fourth mixer also receiving said second data signal and providing a fourth modulated signal;

a first summer connected to said first and second mixers;

a second summer connected to said third and fourth mixers, and connected to subtract an output from said fourth mixer from an output of said third mixer;

a fifth mixer connected to said first summer and to said second quadrature splitter, said fifth mixer receiving said fifth sinusoid and providing a fifth modulated signal;

a sixth mixer connected to said second summer and to said second quadrature splitter, said sixth mixer receiving said sixth sinusoid and providing a sixth modulated signal; and a third summer connected to said fifth and sixth mixers, said third summer providing a resultant modulated signal.

17. The modulator of claim 16 wherein said second and third sinusoids are 90 degrees out of phase.

18. The modulator of claim 16 wherein said fifth and sixth sinusoids are 90 degrees out of phase.

19. The modulator of claim 16 wherein said second, third, fifth, and sixth sinusoids are selected such that said resultant modulated signal is at a difference frequency of said first and fourth sinusoids.

20. The modulator of claim 16 wherein said second, third, fifth, and sixth sinusoids are selected such that said resultant modulated signal is at a sum frequency of said first and fourth sinusoids.

* * * * *